United States Patent
Dorr et al.

(10) Patent No.: US 10,501,181 B1
(45) Date of Patent: Dec. 10, 2019

(54) METHOD AND APPARATUS FOR AERIAL SCANNING AND DETECTION OF CONTACT VOLTAGES AND DISTINGUISHING BETWEEN NORMAL AND ABNORMAL SOURCES OF ELECTRIC FIELDS

(71) Applicant: Electric Power Research Institute, Inc., Palo Alto, CA (US)

(72) Inventors: Douglas Stewart Dorr, Belle Isle, FL (US); John Francis Jansen, Knoxville, TN (US); Reid Leonard Kress, Oak Ridge, TN (US); Doni Joe Nastasi, Knoxville, TN (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 0 days.

(21) Appl. No.: 15/999,496

(22) Filed: Aug. 20, 2018

(51) Int. Cl.
*B64C 39/02* (2006.01)
*H04B 17/318* (2015.01)
(Continued)

(52) U.S. Cl.
CPC ............ *B64C 39/024* (2013.01); *B64D 43/00* (2013.01); *B64D 47/00* (2013.01); *G01R 29/14* (2013.01);
(Continued)

(58) Field of Classification Search
CPC .............. B64C 39/024; B64C 2201/12; B64C 2201/146; H04B 17/318; H04B 17/391;
(Continued)

(56) References Cited

U.S. PATENT DOCUMENTS

| 4,758,792 A | 7/1988 | Polonis et al. |
| 6,329,924 B1 | 12/2001 | McNulty |

(Continued)

FOREIGN PATENT DOCUMENTS

CN     106240822 A  *  12/2016

OTHER PUBLICATIONS

Sarnoff Corp. Report—A Sensor System for Detecting Stray Voltages on Covers, Grates, Light Poles and Other Structures 2002.
(Continued)

*Primary Examiner* — James J Yang
*Assistant Examiner* — Kevin Lau
(74) *Attorney, Agent, or Firm* — Luedeka Neely Group, P.C.

(57) ABSTRACT

A sensor-enabled aerial vehicle carries spatial electric and magnetic field detection sensors and a processing system that employs algorithmic methods to process sensor data. The sensors effectively detect electric and magnetic fields that emanate from energized objects, and the algorithmic methodology analyzes the sensor data to distinguish whether the energized object is unintentionally energized. The aerial propulsion system is enclosed within two electrically conducting hemispheres that are electrically insulated from each other. Alternatively, the hemispheres may be suspended below the aerial vehicle. The hemispheres function as a large area electric-field collection surface, wherein a small alternating current (AC) developed between the two hemispheres is proportional to the collected AC electric fields.

19 Claims, 5 Drawing Sheets

(51) Int. Cl.
*H04B 17/391* (2015.01)
*H04B 5/00* (2006.01)
*G01V 3/08* (2006.01)
*B64D 43/00* (2006.01)
*B64D 47/00* (2006.01)
*G01R 29/14* (2006.01)

(52) U.S. Cl.
CPC ........... *G01V 3/088* (2013.01); *H04B 5/0043* (2013.01); *H04B 17/318* (2015.01); *H04B 17/391* (2015.01); *B64C 2201/12* (2013.01); *B64C 2201/146* (2013.01)

(58) Field of Classification Search
CPC ...... H04B 5/0043; B64D 29/14; B64D 47/00; G01R 29/14; G01V 3/088
See application file for complete search history.

(56) References Cited

U.S. PATENT DOCUMENTS

| | | | |
|---|---|---|---|
| 6,788,215 B1 | 9/2004 | White | |
| 7,248,054 B2 | 7/2007 | Kalokitis et al. | |
| 7,253,642 B2 | 8/2007 | Kalokitis et al. | |
| 7,486,081 B2 | 2/2009 | Kalokitis et al. | |
| 8,482,273 B2 | 7/2013 | Kalokitis et al. | |
| 8,482,274 B2 | 7/2013 | Kalokitis et al. | |
| 8,536,856 B2 | 9/2013 | Kalokitis et al. | |
| 8,575,942 B2 | 11/2013 | Dorr et al. | |
| 8,577,631 B2 | 11/2013 | Kalokitis | |
| 8,598,864 B2 | 12/2013 | Kalokitis et al. | |
| 9,110,120 B2 | 8/2015 | Kalokitis et al. | |
| 9,423,431 B2 | 8/2016 | Kalokitis | |
| 9,520,044 B2 | 12/2016 | Kalokitis et al. | |
| 9,666,057 B2 | 5/2017 | Kalokitis et al. | |
| 9,666,058 B2 | 5/2017 | Kalokitis et al. | |
| 2007/0279067 A1 | 12/2007 | Wiswell et al. | |
| 2011/0184679 A1* | 7/2011 | Kalokitis | G01R 19/145 702/65 |
| 2014/0085095 A1* | 3/2014 | Kalokitis | G01R 31/02 340/657 |

OTHER PUBLICATIONS

Sarnoff Corporation—Advanced Stray Voltage Anomaly Detection System Jul. 24, 2002.

* cited by examiner

METHOD AND APPARATUS FOR AERIAL SCANNING AND DETECTION OF CONTACT VOLTAGES AND DISTINGUISHING BETWEEN NORMAL AND ABNORMAL SOURCES OF ELECTRIC FIELDS

FIELD

This invention relates to electric and magnetic field measurements. More particularly, this invention relates to a system for detecting the existence of unintentionally energized surfaces that may pose a public risk of electric shock.

BACKGROUND

Metallic objects, such as street light poles, in urban areas can become unintentionally electrically energized. Similarly, other conductive objects such as a fence around a playground or ball field can become electrified when nearby underground power cables have insulation degradation. A high contact voltage on such objects may pose a shock hazard to the public, especially where foot traffic is persistent. Causes of dangerous contact voltage include failure of wire insulation, improper electrical rework, and water ingress into fixture wiring.

Some public utilities address the public risk through periodic scanning of publicly-accessible areas to identify unintentionally energized objects. This is commonly accomplished by driving vehicles equipped with electric field sensors along public streets and thoroughfares in urban areas. The limitation to this approach is the necessity to have navigable roads that are near the contact voltage hazards. The potential exists for hazards that are beyond navigable roads, such as boat docks, marinas, fountains in retention ponds, urban parks, playgrounds, stadiums, community ballparks, and any area where floodwaters make thoroughfares impassible. Presently, detecting contact voltages at distances greater than approximately 30 feet away from a navigable roadway requires travel on foot and manual measurement.

A major challenge in identifying unintentionally energized objects is the ability to discern between such objects and the plethora of false positives caused by normal electric field sources, such as overhead power lines and above ground power cords. To address this challenge, a sensor is needed that can detect very weak electric fields at levels that are much lower than detectable using currently available commercial devices. A need also exists for algorithmic methods to combine electric and magnetic field information to identify a contact voltage source in proximity to normally energized objects.

What is needed, therefore, is a detection apparatus and suitable algorithms for detecting inadvertently energized sources by distinguishing between such unintentional sources and the plethora of normally expected electromagnetic sources in a real-world environment.

SUMMARY

Embodiments described herein provide a sensor-enabled aerial vehicle that carries spatial electric and magnetic field detection sensors and a processing system that employs algorithmic methods to process sensor data. The sensors effectively combine the electric and magnetic fields that emanate from nearby energized objects, and the algorithmic methodology analyzes the sensor data to distinguish whether an unintentionally energized object exists.

An embodiment of the detection apparatus includes an aerial propulsion system enclosed within two electrically conducting hemispheres that are electrically insulated from each other. The hemispheres function as a large area electric-field collection surface, wherein a small alternating current (AC) developed by the two hemispheres is proportional to the collected AC electric fields. A preferred material for the hemispheres comprises a nonferrous conducting grid having a grid spacing that is small enough for receiving incident E-field flux lines but is large enough to allow adequate aerodynamic flow from the propulsion system.

The spherical shape of the collection surface is advantageous because of its reduced sensitivity to orientation and directional changes associated with flight. The spherical shape also minimizes distortion of the incident electric field. Further, the hemispheres prevent human contact with the rotating blades associated with the propulsion system.

Thus, the spherical shape for the collection surface is preferred because it allows the field sensitivity of the detection apparatus to be very orientationally tolerant. Other three-dimensional shapes having no corners, such as an ellipsoid of revolution (i.e., football shape), would also work, although they would be more orientationally sensitive. Although not preferred, even surfaces having corners would be functional to some extent.

Also, the nonferrous grid material provides little attenuation to power frequency magnetic fields, thereby allowing the magnetic field energy from nearby power lines to be measured for power line detection and avoidance.

Advantages provided by embodiments of the invention include an improvement in the efficiency of detection of contact voltages in locations beyond vehicle-accessible public areas with electric infrastructure, and improved methods for identifying sources of contact voltages.

Embodiments described herein also advance the state-of-the-art in scanning an area to detect inadvertently energized objects. The conventional process is to move a detection device linearly along a thoroughfare until an alarm threshold is exceeded. Exceeding the alarm threshold triggers a manual inspection of all objects within about a 30 foot radius to either find the inadvertently energized object or identify the false positive that triggered the alarm. Embodiments described herein initiate an automatic grid scan of an area around the point at which the alarm threshold was exceeded during a linear scan. In preferred embodiments, the grid scan is conducted while the aerial vehicle is flying in an autopilot mode, in which the dimensions of the grid and the points at which electric and magnetic field levels are to be measured are programmed into the flight plan. Field level measurements made at the various points in the grid are processed by an algorithm to automatically rule out most, if not all, false positives, and to identify an inadvertently energized object with no manual intervention.

In some embodiments, field level measurements made during a previous scan of an area may be recalled from memory and compared to measurements made during a current scan of the same area. Differences between prior and current field levels measured within the scanned area may be used to trigger the detection apparatus to do a more thorough grid mapping of the area in question.

Some other exemplary applications of the technology described herein include:
   the detection and location mapping of live downed conductors after a storm when floodwaters or debris make the thoroughfares impassible, the detection of live overhead conductors that a fire/ladder truck could inadvertently contact during a fire emergency, and the detection of dangerous energized conductors in the flight path of emergency medical helicopters when landing in low visibility conditions.

As described in more detail hereinafter, an apparatus for detecting unintentionally energized objects includes a first electric field collection surface, and a second electric field collection surface disposed opposite the first electric field collection surface. An electrically insulative structure is disposed between and electrically isolating the first and second electric field collection surfaces. The apparatus includes circuitry for generating an E-field voltage signal proportional to the field strength of an electric field incident on the first and second electric field collection surfaces. The apparatus also includes an aerial vehicle that is mechanically attached to one or both of the first and second electric field collection surfaces.

In some embodiments, the first and second electric field collection surfaces each comprises a hemispherical cage formed of electrically conductive wire.

In some embodiments, the apparatus is configured to allow magnetic fields that originate outside the first and second electric field collection surfaces to be sensed within the first and second electric field collection surfaces.

In some embodiments, the first and second electric field collection surfaces together form a spherical cage around the aerial vehicle. In such embodiments, the first and second electric field collection surfaces are configured to allow aerodynamic flow around the aerial vehicle to provide lift and controlled motion thereof.

In some embodiments, the first and second electric field collection surfaces are suspended below the aerial vehicle.

In some embodiments, the aerial vehicle includes one or more propellers, and the spherical cage formed by the first and second electric field collection surfaces is configured to protect the one or more propellers from contact with objects outside the spherical cage.

In some embodiments, the circuitry includes a transimpedance amplifier electrically connected to the first and second electric field collection surfaces that generates a voltage signal proportional to the electric field incident on the first and second electric field collection surfaces.

In some embodiments, the circuitry includes a processor that executes instructions to detect unintentionally energized objects within a vicinity of the apparatus based at least in part on the E-field voltage signal.

In some embodiments, the processor executes instructions to discern unintentionally energized objects from other energized objects based at least in part on the E-field voltage signal.

In some embodiments, the circuitry includes a magnetic field sensor that generates an H-field voltage signal, which is a voltage signal proportional to a magnetic field detected by the magnetic field sensor.

In some embodiments, the circuitry includes a processor that executes instructions to discern unintentionally energized objects from other energized objects based at least in part on the E-field voltage signal and the H-field voltage signal.

In some embodiments, the circuitry includes a positioning system to generate location information indicative of a location at which an unintentionally energized object is detected.

In some embodiments, the circuitry includes a wireless transceiver for transmitting a message including information regarding the detection of an unintentionally energized object and the location at which the unintentionally energized object is detected.

In another aspect, the invention provides a method for detecting an unintentionally energized object, comprising the steps of:

(a) placing a spherical detection apparatus in a vicinity of the unintentionally energized object using an aerial vehicle, the spherical detection apparatus comprising first and second hemispherical electric field collection surfaces that are electrically insulated from each other;

(b) measuring an electric current induced between the first and second hemispherical electric field collection surfaces caused by an electric field incident on the first and second hemispherical electric field collection surfaces;

(c) based on the electric current, generating a first voltage signal proportional to field strength of the electric field incident on the first and second hemispherical electric field collection surfaces; and (d) processing the first voltage signal to detect the unintentionally energized object.

In some embodiments, the method includes processing the first voltage signal to discern the unintentionally energized object from other energized objects in the vicinity of the unintentionally energized object.

In some embodiments, the method includes:

(e) measuring a magnetic field in the vicinity of the unintentionally energized object;

(f) based on the magnetic field, generating a second voltage signal proportional to the field strength of the magnetic field; and (g) processing the first and second voltage signals to discern the unintentionally energized object from other energized objects.

In some embodiments, the method includes generating location information indicative of a location at which the unintentionally energized object is detected.

In some embodiments, the method includes transmitting a message including information regarding the detection of the unintentionally energized object and the location at which the unintentionally energized object is detected.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
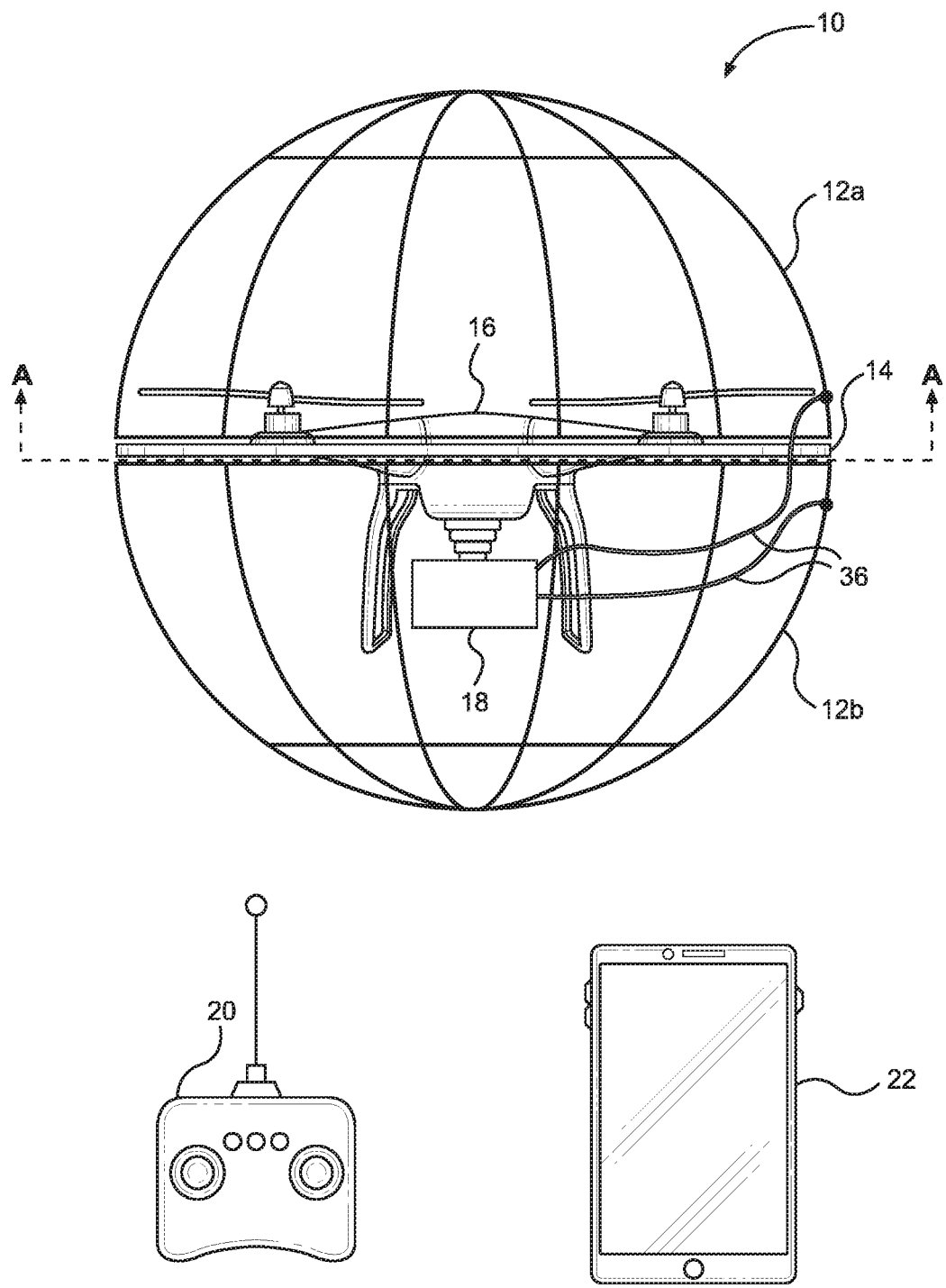
FIG. 1 depicts an electric field detection and discernment apparatus according to a preferred embodiment of the invention.

As shown in FIG. 1, a preferred embodiment of an electric field detection and discernment apparatus 10 includes upper and lower electric field collection surfaces 12a and 12b that form a spherical cage enclosing an aerial vehicle 16 and electric field detection and discernment electronics 18. The upper and lower electric field collection surfaces 12a-12b comprise electrically conductive hemispheres that are electrically isolated from each other by an electrically insulative structure 14. In a preferred embodiment, the diameter of the hemispheres is 16 inches. The nonferrous conductive material of the collection surfaces 12a-12b may be solid metal wire, such as aluminum, or a plastic with conductive coating. In a preferred embodiment, the cross sectional area of the wire is round (such as $118^{th}$ inch diameter), although other shapes such as a T-shaped cross-section could be used to enhance physical strength.

The spacing of the grid elements in the collection surfaces 12a-12b is optimized to provide a compromise between adequate electric field signal detection and acceptable flight characteristics. For example, a spherical shell having a solid surface is optimal for signal detection, but is not conducive to flight. In one embodiment, each of the collection surfaces 12a-12b comprises nine longitudinal conductors that are evenly spaced over the circumference of the hemisphere and connected by to two latitudinal conductors to enhance rigidity. One of the latitudinal wire members of this embodiment is disposed at the termini of the longitudinal conductors and the other is disposed near the vertex.

Besides acting as an insulator, the structure 14 provides a mechanical attachment between the two collection surfaces 12a-12b, and a mechanical attachment of the aerial vehicle 16 to the collection surfaces 12a-12b. In one embodiment, the structure 14 is formed from a plastic material, such as ultra-high molecular weight polyethylene. In an alternative embodiment, the structure 14 is formed from rubber.

Figure 4:
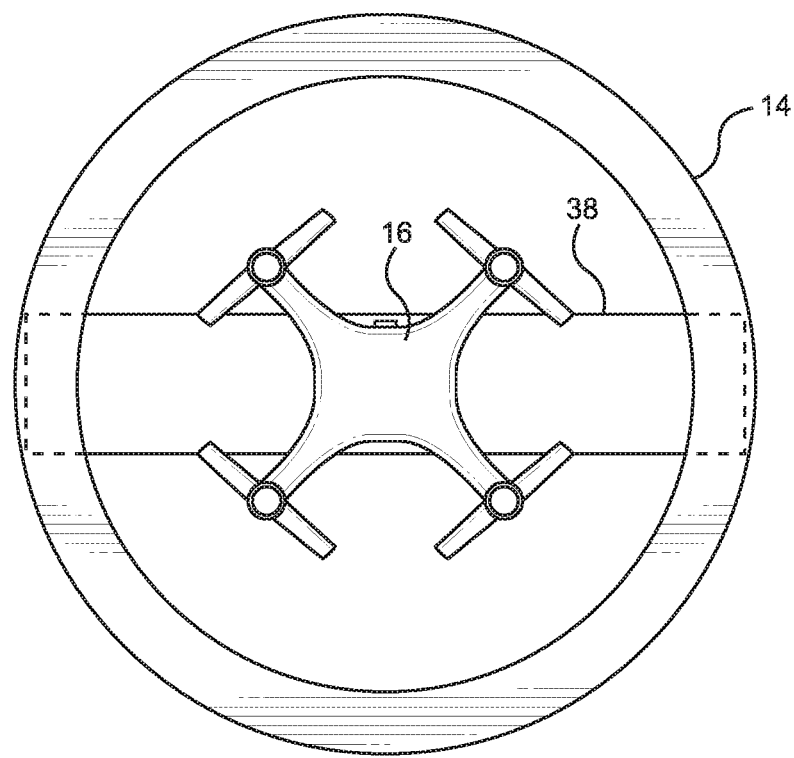
FIG. 4 depicts a structure for attachment of the aerial vehicle to the electric field collection surfaces according to a preferred embodiment of the invention.

FIG. 4 depicts one possible configuration for providing a mechanical attachment of the aerial vehicle 16 to the collection surfaces 12a-12b. In this embodiment, the structure 14 comprises an insulative ring disposed between the circular edges of the collection surfaces 12a-12b. Spanning the ring structure 14 is a rectangular frame 38 that is rigidly attached at each of its ends to opposing portions of the outer perimeter of the upper collection surface 12a. In a preferred embodiment, the frame 38 is formed from an electrically insulative plastic material, such as ultra-high molecular weight polyethylene. The airframe of the aerial vehicle 16 is attached to a central portion of the frame 38.

Figure 5:
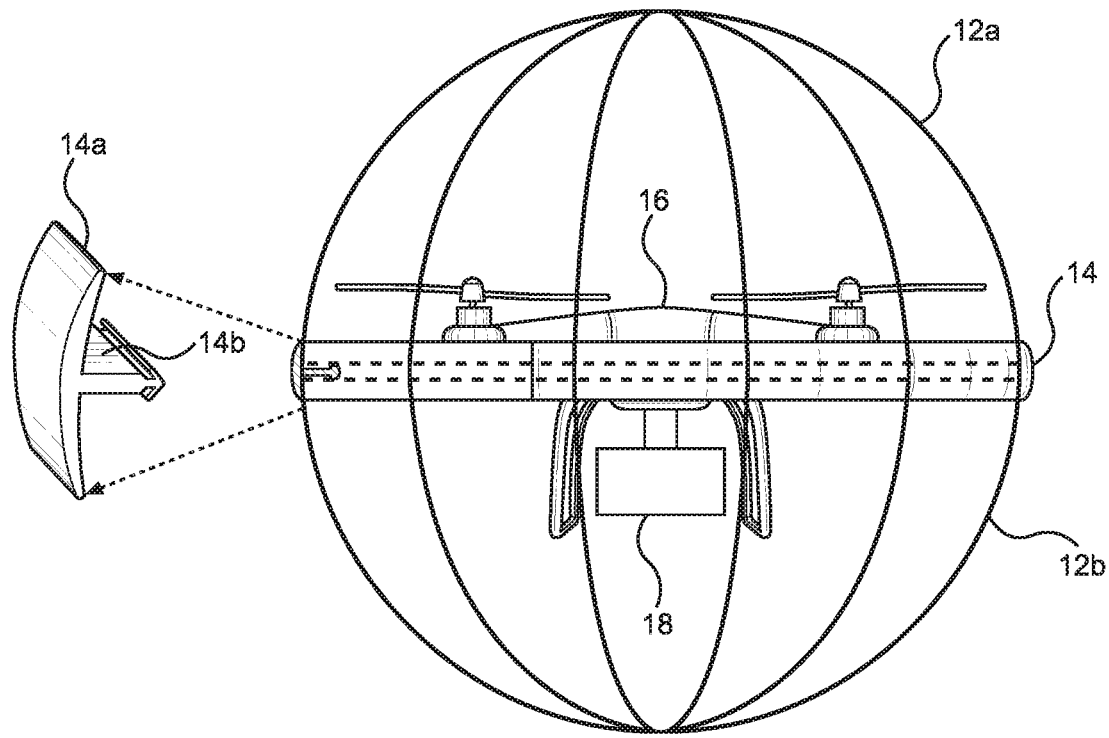
FIG. 5 depicts an electric field detection and discernment apparatus according to an alternative embodiment of the invention.

FIG. 5 depicts an alternative embodiment in which the structure 14 comprises a ring having a "T" cross section. The ring comprises an outer band portion 14a disposed around the outer perimeter of an inner ring portion 14b. The height of the band portion 14a is preferably about 0.5 inch. This prevents the collection surfaces 12a and 12b from sliding horizontally in any direction. The structure 14 is preferably secured to the collection surfaces 12a and 12b using eight plastic clamps that are evenly spaced around the perimeter, although more or fewer clamps could be used. In a preferred embodiment, the T-shaped ring structure 14 is made from styrene butadiene rubber (SBR) and is formed by an extrusion process.

Figure 6:
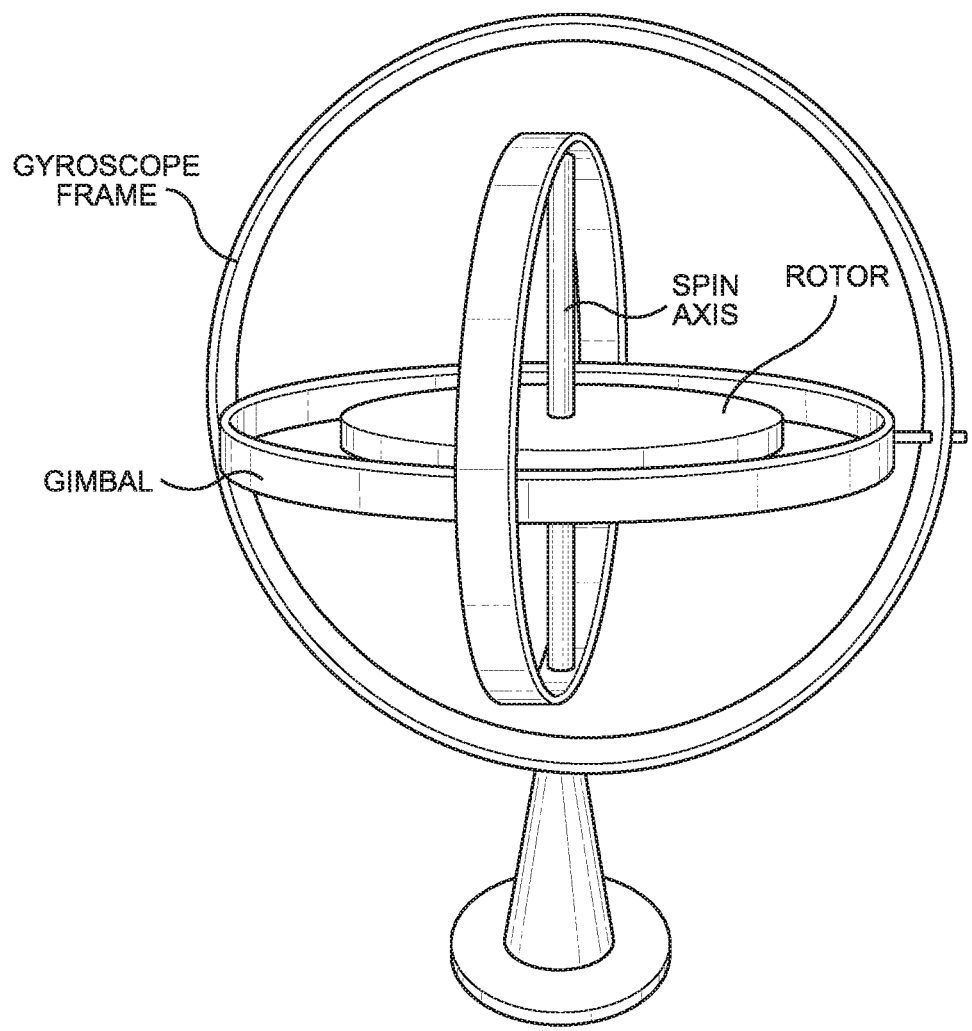
FIG. 6 depicts a structure for attachment of the aerial vehicle to the electric field collection surfaces according to an alternative embodiment of the invention.

In another alternative embodiment, the aerial vehicle 16 is suspended within the sphere formed by the collection surfaces 12a and 12b using a 3-axis gyroscopic mount. A general example of a 3-axis gyroscope is depicted in FIG. 6. In this embodiment, the gyroscope frame in FIG. 6 corresponds to the sphere formed by the collection surfaces 12a and 12b, and the aerial vehicle 16 is mounted in the position of the rotor shown in FIG. 6. The gimbal portion would be formed from electrically insulative material, such as ultra-high molecular weight polyethylene. One advantage of a gyroscopic mount as compared to a rigid mount is that it acts as a shock absorber during flight, reducing the effect of the mass while turning and thrusting. This would provide fluid motion of the sphere with respect to the aerial vehicle, but it could be limited in range by damping springs in order to control orientation.

Figure 2:
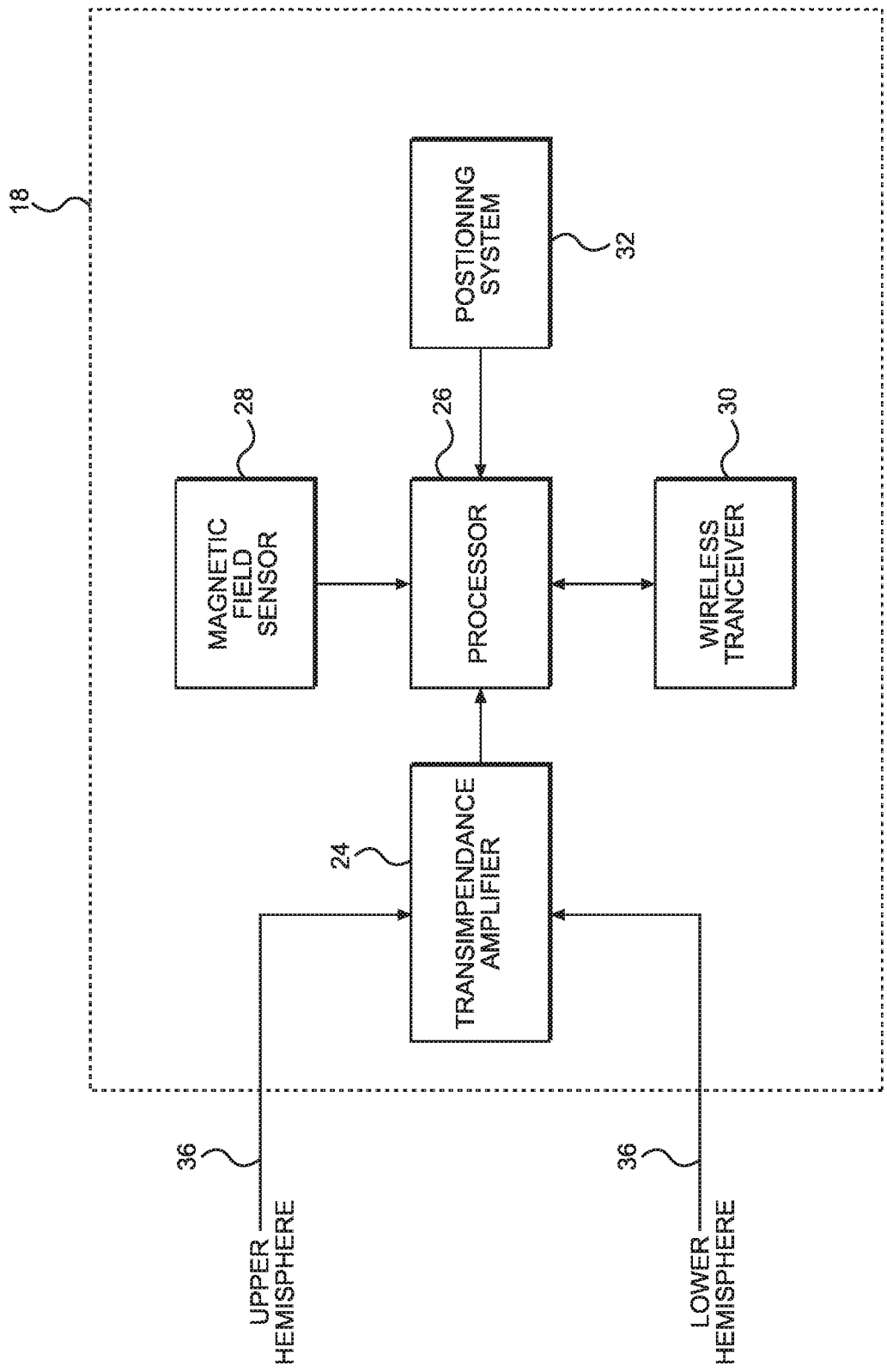
FIG. 2 depicts an electric field detection and discernment circuitry according to a preferred embodiment of the invention.

As shown in FIG. 2, a preferred embodiment of the electric field detection and discernment electronics 18 includes a high-gain, low-noise transimpedance amplifier 24 for measuring the very small AC electric potential between the two collection surfaces 12a-12b when they are exposed to an incident electric field (E-field). The amplifier 24 translates that small AC signal into a measurable output voltage signal that is indicative of the field strength of the E-field incident on the collection surfaces 12a-12b. An example of one such transimpedance amplifier 24 is the model ADA4530-1ARZ chip by Analog Devices. As depicted in FIG. 1, two insulated wires, such as 22-gauge stranded copper, may be used to electrically connect the two collection surfaces 12a-12b to the input of the transimpedance amplifier 24 within the discernment electronics package 18. With reference again to FIG. 2, the E-field voltage signal from the transimpedance amplifier 24 is provided to a processor 26 that, among other functions, executes instructions to implement a field discernment algorithm as described in more detail hereinafter. The electronics 18 also include a magnetic field sensor 28, which in a preferred embodiment is a passive coil sensor capable of detecting signals of about 0.1 milligauss. The output of the magnetic field sensor 28 is a voltage signal that is indicative of the field strength of the magnetic field (H-field) incident on the sensor 28. In a preferred embodiment, this H-field voltage signal is provided to the processor 26 for use in the field discernment algorithm.

Other components of the electronics 18 include a wireless transceiver 30 for wirelessly transmitting E-field detection data, raw measurement data, and positional information data to a remote computer, and receiving commands from a remote computer, as described in more detail hereinafter. The transceiver 30 may be a cellular data transceiver, Wi-Fi transceiver, or other type of wireless transceiver. In a preferred embodiment, the electronics 18 also include a positioning system 32 for generating location coordinates indicative of the geospatial location of the apparatus 10. In one preferred embodiment, the positioning system 32 comprises a global positioning system (GPS) receiver. In other embodiments, the positioning system 32 comprises a photogrammetry or LIDAR system. Position coordinate data from the positioning system 32 is provided to the processor 26 for use in documenting the locations of detected E-fields. Positioning is further enhanced through algorithmic techniques such as a Kalman filter.

A preferred embodiment of a field discernment algorithm for discerning between intentionally energized and unintentionally energized objects takes into account spatial differences in levels of electric fields generated by point sources (such as a contact voltage source) as compared to levels of electric fields generated by line sources. A typical contact voltage source appears as an electric dipole point source, the electric field level of which is proportional to the inverse of the distance cubed from the source. In contrast, the levels of electric fields generated by electric transmission and distribution lines vary as the inverse of the distance squared in a direction orthogonal to the length of the lines. Algorithmically, the spatial variation of the electric field from a contact voltage source, along with the low electric field levels of a contact voltage source compared to levels associated with transmission or distribution lines are important markers to discern a potential contact voltage source from background sources.

Preferred embodiments of the field discernment algorithm also take into account the presence and absence of magnetic fields as the apparatus 10 moves through three-dimensional space. Those of ordinary skill in the art will appreciate that inadvertently energized objects generally do not generate a magnetic field because there is no current flow. Thus, the detection of an electric field in the absence of a magnetic field indicates the presence of an inadvertently energized object. Thus, one embodiment of the field discernment algorithm (1) detects an electric field in the absence of a magnetic field, (2) measures the vector (three-dimensional) distance between the apparatus 10 and the energized object while compensating for changes in distance as the apparatus 10 moves with respect to the object, and (3) disregarding persistent signals from other sources, such as power lines.

As shown in FIG. 1, a preferred embodiment of the apparatus 10 includes a wireless remote controller unit 20 for controlling the flight of the aerial vehicle 16. The apparatus 10 also preferably includes a mobile device 22, such as a mobile phone or tablet computer. The mobile device 22 is preferably configured with a custom application for receiving messages transmitted from the transceiver 30, such as messages indicating the detection of a contact voltage and its location. The mobile device 22 may also be used to transmit commands to the transceiver 30 to control operation of the discernment electronics 18. The application on the mobile device 22 may also be used to send/receive messages to/from the operating system of the aerial vehicle 16. In some embodiments, data logging and the field discernment algorithm may be implemented in a processor in the mobile device 22, rather than in the processor 26 of the electronics 18.

Figure 3:
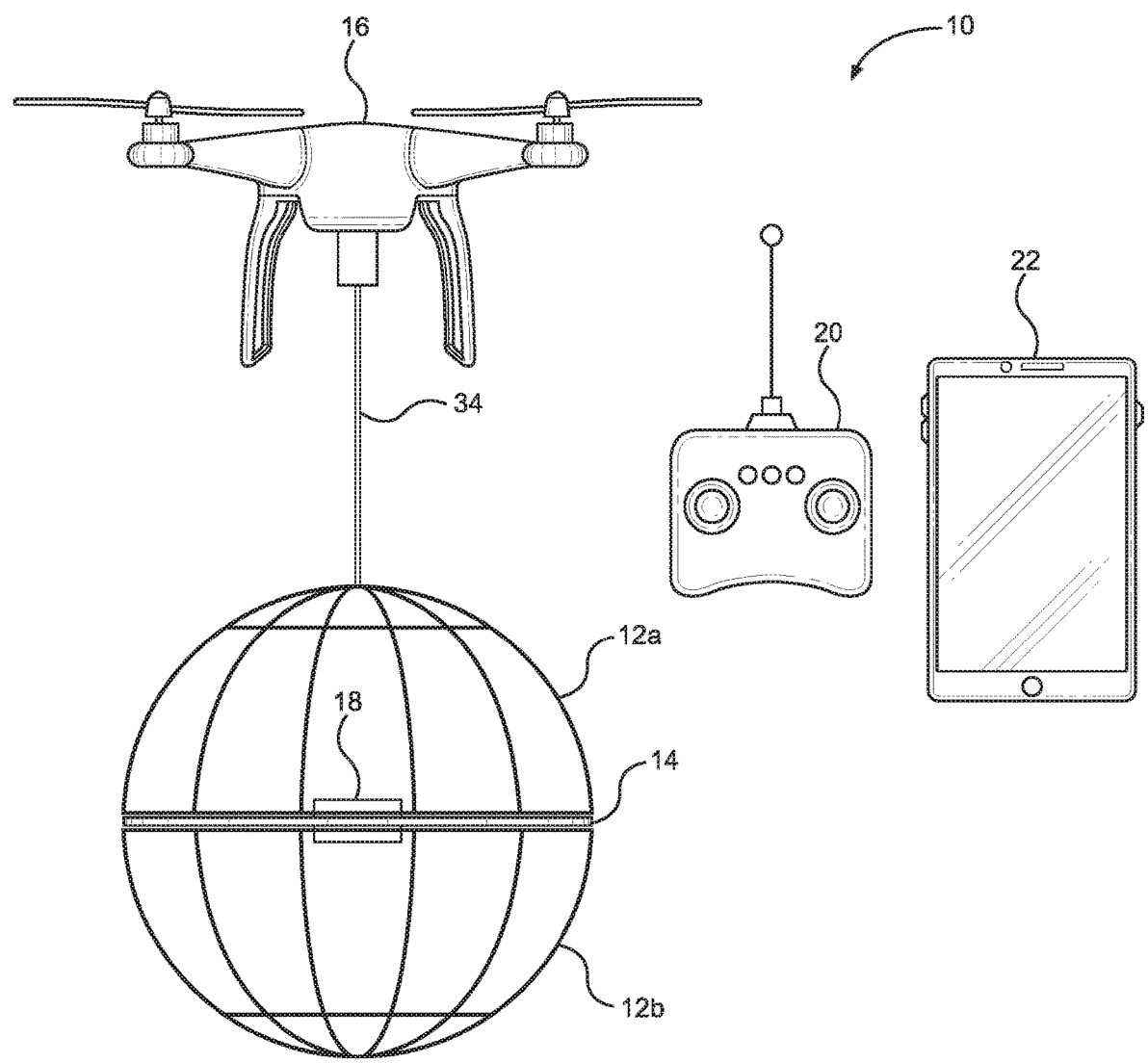
FIG. 3 depicts an electric field detection and discernment apparatus according to an alternative embodiment of the invention.

In an alternative embodiment depicted in FIG. 3, the electric field collection surfaces 12a-12b and the discernment electronics 18 are suspended below the aerial vehicle 16 by a tether 34 that is preferably formed from an electrically insulating material, such as plastic. In this embodiment, a preferred diameter for the sphere formed by the surfaces 12a-12b is approximately 12 inches. Although a smaller diameter can be implemented, the effectiveness of electric field detection is reduced. The tether length between the aerial vehicle 16 and the sphere is preferably optimized both for flight and for minimizing electric field interference from the aerial vehicle 16. In one embodiment, separation distance is two sphere diameters. Objects near the collection surfaces can distort the electric field lines, so a two-diameter separation between sphere and aerial vehicle is a compromise between aircraft agility and sensing interference.

In the embodiment shown in FIG. 1, electric fields that are generated inside the hemispheres 12a-12b, e.g. from vehicle 16, are effectively shielded from the external electrical fields that are being measured by the sensor. Also, placing the propulsion and electronics inside the sphere minimizes the effect of external obstructions, thereby allowing externally-generated E-field lines to remain uniform around the sphere. Because preferred embodiments are configured to detect only 60 Hz electric fields, any high-frequency electric fields that are generated within the sphere can be ignored.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An apparatus for detecting unintentionally energized objects, comprising:
    a first electric field collection surface formed of electrically conductive material;
    a second electric field collection surface formed of electrically conductive material disposed opposite the first electric field collection surface, wherein the first and second electric field collection surfaces form first and second portions, respectively, of a cage;
    an electrically insulative structure disposed between and electrically isolating the first and second electric field collection surfaces;
    circuitry for generating an E-field voltage signal indicative of a field strength of an electric field incident on the first and second electric field collection surfaces; and
    an aerial vehicle mechanically attached to one or both of the first and second electric field collection surfaces, wherein the aerial vehicle is disposed within the cage.

2. The apparatus of claim 1 wherein the first and second electric field collection surfaces are both hemispherical.

3. The apparatus of claim 1 configured to allow magnetic fields that originate outside the first and second electric field collection surfaces to be sensed within the first and second electric field collection surfaces.

4. The apparatus of claim 1 wherein the first and second electric field collection surfaces each comprises a hemispherical cage and together the hemispherical cages form a spherical cage, and wherein the aerial vehicle is disposed within the spherical cage formed by the first and second electric field collection surfaces.

5. The apparatus of claim 1, wherein the aerial vehicle is suspended within the cage using a 3-axis gyroscopic mount.

6. The apparatus of claim 1 wherein the cage is configured to allow aerodynamic flow around the aerial vehicle to provide lift and controlled motion thereof.

7. The apparatus of claim 1 wherein the aerial vehicle includes one or more propellers, and the cage is configured to protect the one or more propellers from contact with objects outside the spherical cage.

8. The apparatus of claim 1 wherein the circuitry includes a transimpedance amplifier electrically connected to the first and second electric field collection surfaces that generates a voltage signal proportional to the electric field incident on the first and second electric field collection surfaces.

9. The apparatus of claim 1 wherein the circuitry includes a processor that executes instructions to detect unintentionally energized objects within a vicinity of the apparatus based at least in part on the E-field voltage signal.

10. The apparatus of claim 9 wherein the processor executes instructions to discern unintentionally energized objects from other energized objects based at least in part on the E-field voltage signal.

11. The apparatus of claim 1 wherein the circuitry includes a magnetic field sensor that generates an H-field voltage signal, which is a voltage signal proportional to a magnetic field detected by the magnetic field sensor.

12. The apparatus of claim 11 wherein the circuitry includes a processor that executes instructions to discern unintentionally energized objects from other energized objects based at least in part on the E-field voltage signal and the H-field voltage signal.

13. The apparatus of claim 9 wherein the circuitry includes a positioning system to generate location information indicative of a location at which an unintentionally energized object is detected.

14. The apparatus of claim 13 wherein the circuitry includes a wireless transceiver for transmitting a message including information regarding the detection of an unintentionally energized object and the location at which the unintentionally energized object is detected.

15. A method for detecting an unintentionally energized object, comprising:
  (a) placing a detection apparatus in a vicinity of the unintentionally energized object using an aerial vehicle, the detection apparatus comprising first and second electric field collection surfaces formed of electrically conductive material that are electrically insulated from each other, wherein the first and second electric field collection surfaces form first and second portions, respectively, of a cage, and wherein the aerial vehicle is disposed within the cage;
  (b) measuring an electric current induced between the first and second electric field collection surfaces caused by an electric field incident on the first and second electric field collection surfaces;
  (c) based on the electric current, generating a first voltage signal proportional to a field strength of the electric field incident on the first and second electric field collection surfaces; and
  (d) processing the first voltage signal to detect the unintentionally energized object.

16. The method of claim 15, wherein the detection apparatus is spherical, and wherein the first and second electric field collection surfaces are hemispherical.

17. The method of claim 15 further comprising processing the first voltage signal to discern the unintentionally energized object from other energized objects in the vicinity of the unintentionally energized object.

18. The method of claim 15 further comprising:
  (e) measuring a magnetic field in the vicinity of the unintentionally energized object;
  (f) based on the magnetic field, generating a second voltage signal proportional to a field strength of the magnetic field; and
  (g) processing the first and second voltage signals to discern the unintentionally energized object from other energized objects.

19. The method of claim 15 further comprising generating location information indicative of a location at which the unintentionally energized object is detected.

* * * * *